US006153962A

United States Patent [19]

Noma et al.

[11] Patent Number: 6,153,962

[45] Date of Patent: Nov. 28, 2000

[54] PIEZOELECTRIC TRANSFORMER INVERTER

[75] Inventors: Takashi Noma, Nagaokakyo; Kyoji Toshinari, Kyoto; Yasuyuki Morishima, Kyotanabe, all of Japan

[73] Assignee: Murata Manufacturing Co., Ltd., Japan

[21] Appl. No.: 09/399,279

[22] Filed: Sep. 17, 1999

[30] Foreign Application Priority Data

Sep. 21, 1998 [JP] Japan .................................. 10-266653

[51] Int. Cl.[7] ...................................................... H01L 41/08

[52] U.S. Cl. ................................ 310/316.01; 315/209 PZ

[58] Field of Search .................................... 310/358, 359, 310/316.01, 317, 319; 363/97, 133; 315/209 R, 209 PZ, 307

[56] References Cited

U.S. PATENT DOCUMENTS

| | | | |
|---|---|---|---|
| 5,705,879 | 1/1998 | Abe et al. | 310/316.01 X |
| 5,894,184 | 4/1999 | Furuhashi et al. | 310/316.01 |
| 5,942,835 | 8/1999 | Furuhashi et al. | 310/316.01 |

FOREIGN PATENT DOCUMENTS 9107684 of 1997 Japan .

OTHER PUBLICATIONS

U.K. Search Report issued Oct. 18, 1999 in a related application.

*Primary Examiner*—Mark Budd

*Attorney, Agent, or Firm*—Ostrolenk, Faber, Gerb & Soffen, LLP

[57] ABSTRACT

A piezoelectric transformer inverter comprises: a piezoelectric transformer for performing voltage conversion of alternating voltage applied between primary electrodes to supply to a load connected to a secondary electrode; a driving-frequency control unit for controlling load current during driving of the load by changing the driving frequency of the piezoelectric transformer; a chopper unit for chopping input voltage applied into the driving-frequency control unit at a frequency of two or more times as high as the driving frequency and for controlling an average input voltage applied into the driving frequency control unit by changing a duty ratio of the chopping operation; and a dimming unit for intermittently stopping the driving frequency control unit by intermittently stopping the operation of the chopper unit at a frequency smaller than the driving frequency of the piezoelectric transformer, wherein even during a period in which the dimming unit is intermittently stopping the chopper unit, signals having a duty ratio for allowing the chopper unit to perform the chopping operation to be sustained inside the chopper unit.

22 Claims, 10 Drawing Sheets

PIEZOELECTRIC TRANSFORMER INVERTER

BACKGROUND OF THE INVENTION

1. Field of the Invention

The present invention relates to a piezoelectric transformer inverter. More specifically, it relates to a piezoelectric transformer inverter for lighting a fluorescent tube (a cold cathode fluorescent tube) used to backlight a liquid crystal display panel.

2. Description of the Related Art

It is common to use a fluorescent tube, such as a cold cathode fluorescent tube, to back light a liquid-crystal display in a portable information-processing device such as a mobile phone or a notebook-size personal computer. A high power alternating voltage must be used to light the fluorescent tube. Portable information processing devices, such as a notebook personal computer typically use both a battery and an AC adapter as power sources. In order for such power sources to energize a fluorescent-tube-lighting system, a DC/AC inverter for converting a low power direct current voltage from an input power supply into an alternating voltage capable of lighting the fluorescent tube, must be provided. Recently, a piezoelectric transformer inverter incorporating a piezoelectric transformer which is smaller than an electromagnetic transformer, has been under development for lighting a fluorescent tube. Such a piezoelectric transformer inverter preferably has the following performance capabilities:

(1) a wide input-voltage range so that it can be driven either by a battery or a battery charger; and (2) a wide luminance-dimming range so that power consumption can be reduced by dimming the brightness of the display screen of a liquid crystal display panel (which is equivalent to the luminance of a cold cathode fluorescent tube) and so that its operating life can be lengthened.

Japanese Unexamined Patent Publication No. 9-107684 discloses one such piezoelectric transformer inverter. The structure of this piezoelectric transformer inverter is shown in FIG. 1. The piezoelectric transformer inverter 1 includes a piezoelectric transformer 3 for applying a tube voltage to a fluorescent tube 2; a frequency control circuit 4 for detecting a tube current supplied to the fluorescent tube 2 from secondary electrodes of the piezoelectric transformer 3 to control the driving frequency of the piezoelectric transformer 3 in order to maintain the tube current at a specified value; a step-up circuit (drive circuit) 5 for allowing a frequency-dividing circuit 12 to divide the driving frequency generated by the frequency control circuit 4 and a generating drive voltage of the divided frequency which is applied to the primary electrodes of the piezoelectric transformer 3; a drive-voltage control circuit 6 for controlling the drive voltage applied to the piezoelectric transformer 3 in such a manner that it is equivalent to a specified voltage even if the input power supply voltage $V_S$ changes; and a dimming circuit 7 for performing a PWM-control of an average tube-current flowing in the fluorescent tube 2.

The step-up circuit 5 includes a pair of transistors 8 and 9, and a pair of coils 10 and 11 connected to operate as a push-pull circuit (class quasi-E operation). In a piezoelectric transformer inverter 1 performing such a push-pull operation, the drive voltage $V_D$ applied between the primary electrodes of the piezoelectric transformer 3 by switching the two transistors 8 and 9 on and off closely approximates a sine wave. Additionally, since the piezoelectric transformer inverter 1 performs a push-pull operation using the two coils 10 and 11 and transistors 8 and 9, respectively, the drive voltage $V_D$ applied to the piezoelectric transformer 3 can double the pulsed supply voltage $V_{PS}$ applied to the step-up circuit 5.

The frequency control circuit 4 controls the operation of step-up circuit 5 so as to ensure that the tube current flowing through fluorescent tube 2 is at a desired level. To this end, the tube current is applied to a current-voltage conversion circuit 13 which converts the current $I_1$ flowing into the fluorescent tube 2 into a voltage $V_1$ proportional to the tube current. This voltage is rectified by a rectifying circuit 14 to generate a direct-current voltage $V_2$ which is applied to one input of comparator 15. The direct-current voltage $V_2$ and a reference voltage $V_{ref}$ are compared by the comparator 15 and a direct-current voltage $V_3$ (indicative of the current flowing $I_1$ flowing through fluorescent tube 2) whose magnitude varies as a function of the relative size of voltages $V_2$ and $V_{ref}$, is output from the comparator 15 and is integrated by an integrating circuit 16 to generate a driving frequency control signal $V_4$. Oscillation frequencies of triangle waves $V_5$ and rectangular waves $V_6$ output from respective outputs of a voltage-controlled oscillator (VCO) 17 are controlled according to the driving frequency control signal $V_4$. This arrangement permits the frequency of the rectangular wave $V_6$ output from the frequency control circuit 4 to vary and permits driving-frequency control to be performed so that the current $I_1$ flowing in the fluorescent tube 2 is maintained at a desired current value.

However, in an attempt to control the tube current $I_1$ only as a function of the driving frequency control signal $V_6$, when the power supply voltage $V_S$ increases, the driving frequency deviates greatly from the proximity of a resonance frequency at which the piezoelectric transformer 3 is most efficient, resulting in a significant reduction of the conversion efficiency.

To avoid this problem, a drive-voltage control circuit 6 is disposed between the step-up circuit 5 and the power supply voltage $V_S$ and converts the power supply voltage $V_S$ into a pulsed supply voltage $V_{PS}$ whose average value is maintained constant by varying the duty cycle at which the switching device 19 of the drive-voltage control circuit 6 is switched on and off. In the drive-voltage control circuit 6 the drive voltage applied to one of the primary electrodes of the piezoelectric transformer 3 is rectified by a rectifying circuit 20 to convert it into a direct current voltage $V_7$ which is applied to one input of a comparator 21. The comparator 21 compares triangle waves $V_5$ output from frequency control circuit 4 with the direct current output $V_7$ of the rectifying circuit 20 to output rectangular waves $V_8$ whose duty cycle varies as a function of both the drive voltage $V_D$ applied to the piezoelectric transformer 3 and the tube current $I_1$ flowing through the fluorescent tube 2. When the output of comparator 21 is low (L), the switching device 19 is turned on. When the output of comparator 21 is high (H), the switching device 19 is turned off. This forms a feedback circuit which maintains the drive voltage $V_D$ applied to the piezoelectric transformer 3 substantially constant.

The feedback circuit operates as follows. When the power supply voltage $V_S$ decreases, the drive voltage $V_D$ of the piezoelectric transformer 3 decreases as does the direct current voltage $V_7$ output from the rectifying circuit 20. In response to the decreasing drive voltage $V_D$, the duty ratio (the ON-duty) of the switching device 19 increases and the average value of the pulsed supply voltage $V_{PS}$ supplied to the step-up circuit 5 increases thereby increasing the drive voltage $V_D$ to the desired value. In contrast, when the power supply voltage $V_S$ increases, the drive voltage $V_D$ increases and the direct current voltage $V_7$ which is output from the rectifying circuit 20 increases, therefore decreasing the duty ratio of the switching device 19 and the average value of the pulsed supply voltage $V_{PS}$ (and therefore the drive voltage $V_D$) is reduced. In this way, even if the power supply voltage $V_S$ varies, the average drive voltage $V_D$ supplied to the piezoelectric transformers can be maintained substantially constant, so that the control-varying width of the driving frequency signal $V_5$ output by frequency control circuit 4 can be set small enough to be able to adapt to a wide range of input voltages $V_S$.

The dimming circuit 7 adjusts the dimming range of the fluorescent tube 2 as a function of a dimming voltage applied thereto. In the dimming circuit 7, the comparator 23 compares triangular waves $V_9$ output from a triangular wave generation circuit 22 with the dimming voltage and generates rectangular waves $V_{10}$ as an output. When the dimming voltage increases, the duty ratio of the rectangular waves $V_{10}$ output from the comparator 23 decreases and vice-versa.

An OR gate 18 is connected to a control terminal (gate) of the switching device 19 which is disposed in the drive voltage control circuit 6. The rectangular waves output from the dimming circuit 7 have a substantially lower frequency than the rectangular waves $V_8$ output from the comparator 21. While the duty cycle of the rectangular waves $V_8$ generated by comparator 21 control the average value of the pulsed supply voltage $V_{PS}$ during the time periods in which tube 2 is turned on (and thereby stabilize the tube current $I_1$ at a desired value), the duty cycle of the rectangular waves $V_{10}$ generated by a dimming circuit 7 control the time periods in which the fluorescent tube 2 is on and thereby control the apparent rightness of the light generated by tube 2.

More particularly, the tube current $I_1$ flows intermittently and the fluorescent tube flickers on and of with a frequency and duty cycle determined by rectangular waves $V_{10}$. If the frequency of the flicker is set to approximately 210 Hz, the flicker will be imperceptible and will look as if the luminance of the fluorescent tube is being dimmed. Accordingly, by changing the duty cycle at which the switching device 19 is turned on and off it is possible to achieve a wide dimming range.

However, the above conventional circuit has the following technical problems. FIGS. 2A through 2F show the operating states of piezoelectric transformer inverter 1, when the output $V_{10}$ of the dimming circuit changes from low to high and back to low. FIG. 2A shows the waveform of the rectangular pulses $V_{10}$ generated by the dimming circuit 7 (the output of comparator 23). FIG. 2B shows the waveform of the triangular waves $V_5$ generated by the frequency control circuit 4 (one output of the voltage-controlled oscillator 17) and the waveform of the DC output $V_7$ appearing at the output of the rectifying circuit 20. FIG. 2C shows the pulsed output signal $V_8$ generated by the comparator 21 of the drive voltage control circuit 6. FIG. 2D shows an output $V_{11}$ of the OR gate 18, FIG. 2E shows the pulsed supply voltage $V_{PS}$ appearing at the output of the drive voltage control circuit 6, and FIG. 2F shows the drive voltage $V_D$ applied to the piezoelectric transformer 3.

As shown in FIGS. 2B and 2C, the direct current voltage $V_7$ (which is indicative of the magnitude of the drive voltage $V_D$ applied to the piezoelectric transformer 3) is compared to the triangular wave $V_5$ from the frequency control circuit 4 in comparator 21 which generates a pulsed output $V_8$ as a function thereof. This signal is OR'ed with the dimming signal $V_{10}$ to control the operation of switching device 19 and thereby control the generation of the pulsed supply voltage $V_{PS}$ as shown in FIGS. 2A, 2D, and 2E.

However, during a period in which the drive voltage control circuit 6 is intermittently turned off by the dimming signal $V_{10}$ (that is, during a period in which the dimming signal $V_{10}$ is high (H)), the drive voltage $V_D$ is zero, as shown in FIG. 2F. As a result, output $V_7$ of the rectifying circuit 20 is reduced and the output $V_8$ of the comparator 21 (FIG. 2C) is low (L). Subsequently, when the dimming signal $V_{10}$ returns to its low state (L) and the drive voltage control circuit 6 restarts operation, the output $V_7$ of the rectifying circuit 20 is increased, and the pulsed supply voltage $V_{PS}$ is increased to reach a desired value.

As shown in FIG. 2E, during the transitional period from the restart of operation by the drive voltage control circuit 6 to the stabilization of the output $V_7$ of the output $V_7$ of the rectifying circuit output 20 at the desired value, the average value of the pulsed supply voltage $V_{PS}$ is too large because the duty ratio of the switching device 19 is too large. This increased duty cycle causes the drive voltage $V_D$ to spike during the transition period (FIG. 2F) resulting in the following problems (1) stress to the piezoelectric transformer 3 is large and (2) an FET having a large withstand voltage needs to be used for transistors 8 and 9 of the step-up circuit 5.

SUMMARY OF THE INVENTION

The present invention is directed to a piezoelectric transformer inverter which reduce the stresses applied to the piezoelectric transformer when the output of a dimming unit is inverted and which can use components (signal transistors) in the step-up circuit having a lower breakdown voltage.

The piezoelectric transformer inverter comprises a piezoelectric transformer for performing voltage conversion of alternating voltage applied between primary electrodes to supply to a load connected to a secondary electrode; a driving-frequency control unit for controlling load current during driving of the load by changing the driving frequency of the piezoelectric transformer; a chopper unit for chopping input voltage applied into the driving-frequency control unit at a frequency of two or more times as high as the driving frequency and for controlling an average input voltage applied into the driving frequency control unit by changing a duty ratio of the chopping operation; and a dimming unit for intermittently stopping the driving frequency control unit by intermittently stopping the operation of the chopper unit at a frequency smaller than the driving frequency of the piezoelectric transformer; wherein even during a period in which the dimming unit is intermittently stopping the chopper unit, signals having a duty ratio for allowing the chopper unit to perform the chopping operation to be sustained inside the chopper unit.

In this case, the signals having the duty ratio for allowing the chopper unit to perform the chopping operation are signals for switching on/off switching devices, when the chopper unit is performing the chopping operation by switching on/off the switching devices. Furthermore, the intermittent stop of the chopper unit includes, in addition to a case in which there is no output from the chopper unit, a case in which there is output enough not to allow a load to drive due to small output from the piezoelectric transformer. For the purpose, the chopper unit may have a switching device for driving or stopping it; the signals having the duty ratio for allowing the chopper unit to perform the chopping operation may allow the switching device to be turned on or turned off; and the switching device and the signals having the duty ratio for allowing the chopper unit to perform the chopping operation may be connected or disconnected by an output level of the dimming unit.

In the piezoelectric transformer inverter of the conventional embodiment, during the period in which the operation of the chopper unit is being stopped by the dimming unit, operations of the chopper unit is stopped by generating no signals having the duty ratio for allowing the chopper unit to perform the chopping operation. In contrast to this, in a piezoelectric transformer of the present invention, even during the period in which the operation of the chopper unit is being stopped by the dimming unit, the signals having the duty ratio for allowing the chopper unit to perform the chopping operation are sustained and are continuously generated, while the operation of the chopper unit is at rest.

Accordingly, when the chopper unit is brought from the operation-suspending state into the driving state by the dimming unit, the chopper unit immediately performs the chopping operation in an approximately normal duty ratio, whereby this can prevent the piezoelectric transformer input voltage from becoming transitionally too large. Consequently, compared with the conventional case, no excessive stress is applied to the piezoelectric transformer when the dimming unit output voltage changes. Furthermore, since no excessive drive voltage is applied to the piezoelectric transformer, low-cost devices with a low withstand voltage can be used for devices driving the piezoelectric transformer, such as an FET.

According to another embodiment, a piezoelectric transformer inverter comprises a piezoelectric transformer for performing voltage conversion of alternating voltage applied between primary electrodes to supply to a load connected to a secondary electrode; a driving-frequency control unit for controlling load current during driving of the load by changing the driving frequency of the piezoelectric transformer; a chopper unit for chopping input voltage applied into the driving-frequency control unit at a frequency of two or more times as high as the driving frequency and for controlling an average input voltage applied into the driving frequency control unit by changing a duty ratio of the chopping operation; and a dimming unit for intermittently stopping the driving frequency control unit by intermittently stopping the operation of the chopper unit at a frequency smaller than the driving frequency of the piezoelectric transformer; in which when the chopper unit is turned from stopping to driving by the dimming unit, the duty ratio for allowing the chopper unit to perform the chopping operation is set to gradually increase.

In this piezoelectric transformer inverter, when the chopper unit is changed from the stopping state into the driving state, the duty ratio for the chopping operation in the chopper unit is gradually increased up to a duty ratio in the driving period. Thus, even when the chopper unit is brought from the stopping state into the driving state by the dimming unit, the duty ratio of the chopper unit is not too large, so that this can prevent the piezoelectric transformer input voltage from becoming transitionally too large. Accordingly, no excessive stress is applied to the piezoelectric transformer when the dimming unit output voltage changes, in contrast with the conventional case. Moreover, since too much drive voltage is not applied to the piezoelectric transformer, low-cost devices with a low withstand voltage can be used for devices driving the piezoelectric transformer, such as an FET.

For the purpose of illustrating the invention, there is shown in the drawings several forms which are presently preferred, it being understood, however, that the invention is not limited to the precise arrangements and instrumentalities shown.

DETAILED DESCRIPTION OF THE INVENTION

Hereinafter, the preferred embodiments of the present invention are explained in detail with reference to the drawings.

First Embodiment

Figure 1:
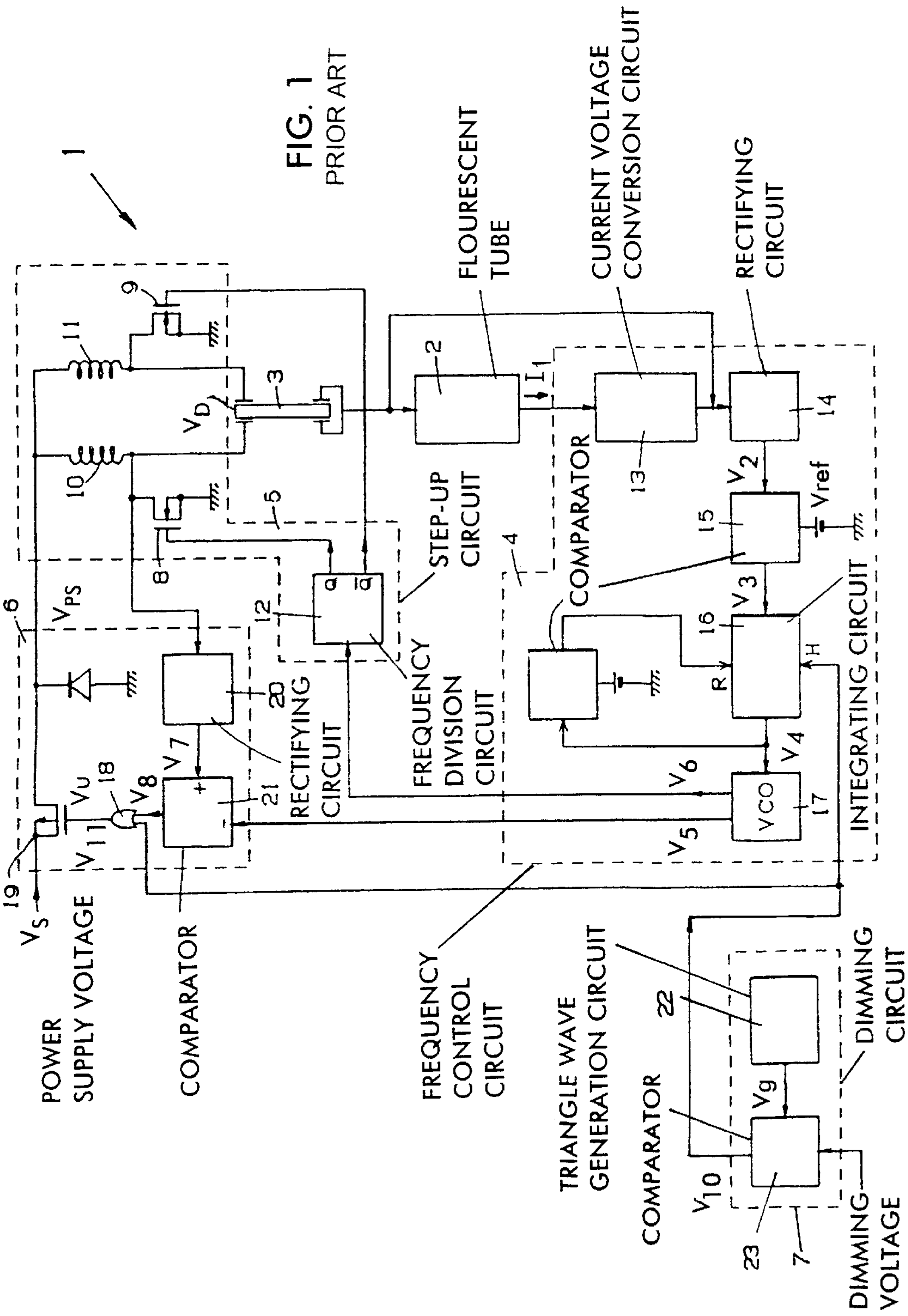
FIG. 1 PRIOR ART
FIG. 1 is a circuit diagram showing a structure of a piezoelectric transformer inverter of a conventional embodiment.
Figures 2A, 2B, 2C, 2D, 2E, 2F:
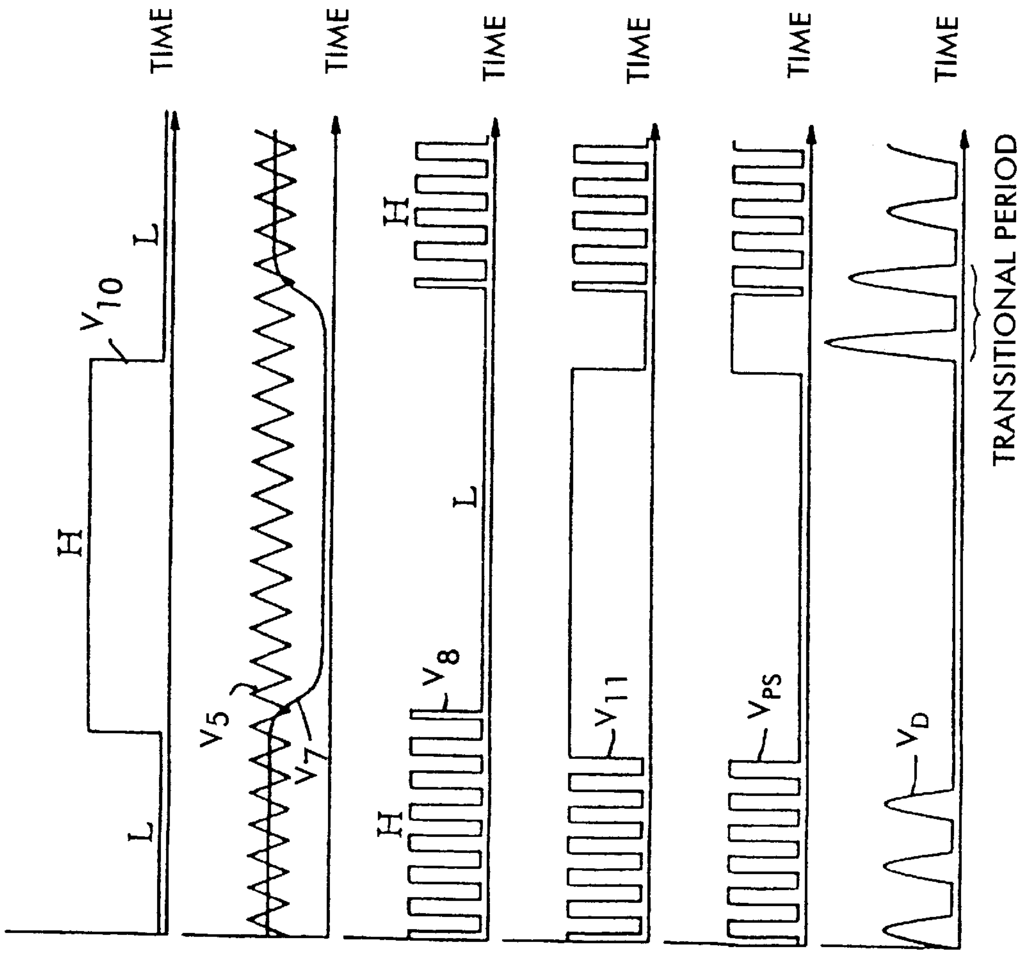
FIGS. 2A to 2F show waveforms measured at various points in the piezoelectric transformer inverter shown in FIG. 1.
Figure 3:
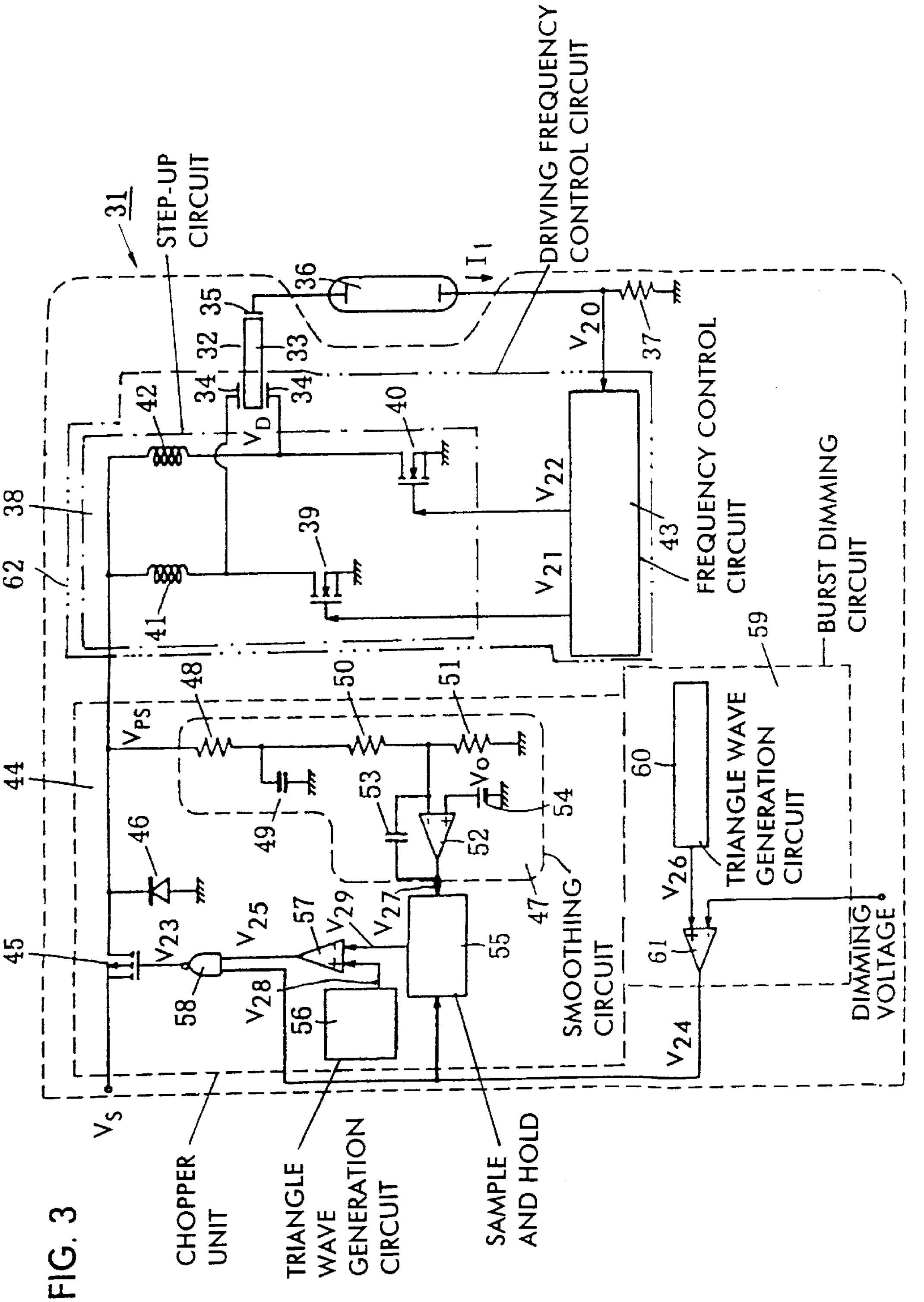
FIG. 3 is a circuit diagram showing a structure of a piezoelectric transformer inverter according to an embodiment of the present invention.

FIG. 3 shows a piezoelectric transformer inverter 31 according to a first embodiment of the present invention. The piezoelectric transformer inverter preferably maintains the frequency of the tube current $I_1$ in the fluorescent tube 36 constant, maintains the magnitude of the drive voltage $B_D$ applied to the piezoelectric transformer 32 constant during the periods during which the tube 36 is turned on and turn the fluorescent tube 36 on and off with a duty cycle which varies as a function of the desired brightness of the tube. To this end, the piezoelectric transformer of FIG. 3 inverter 31 preferably includes four circuit blocks: a piezoelectric transformer 32, a driving frequency control circuit 62, a chopper unit 44, and a burst dimming unit 59. Driving frequency control circuit 62 includes a step-up circuit 38 and a frequency control circuit 42.

The piezoelectric transformer 32 takes advantage of piezoelectric effects to step up the alternating voltage applied between its primary electrodes 34 to generate an alternating current (tube current) at its secondary electrode 35. The alternating current is supplied to a fluorescent tube 36 (more generally, a load), such as a cold cathode fluorescent tube, to switch it on. The piezoelectric transformer 32 used here is preferably, but not necessarily, a Rosen-type piezoelectric transformer 32, in which primary electrodes 34 are disposed on opposite main surfaces of one-side area of the piezoelectric substrate 33 and polarization processing is performed in a direction perpendicular to the faces of the primary electrodes 34. A secondary electrode 35 is disposed on the end face of the other side area of the piezoelectric substrate 33 and polarization processing is performed in a direction perpendicular to the face of the secondary electrode 35. The fluorescent tube 36 and a detection resistor 37 are connected in series between the secondary electrode 35 and ground.

The fluorescent tube 36 operates most efficiently at a predetermined tube current frequency. In order to maintain the tube current $I_1$ at the desired frequency, the frequency control circuit 43 monitors the tube current $I_1$ and controls the operation of step-up circuit 38 to maintain the tube current at the desired frequency. To this end, the voltage $V_{20}$ between the fluorescent tube 36 and the detection resistor 37 is input to the frequency control circuit 43, which detects the frequency of the tube current $I_1$. The respective outputs $V_{21}$, $V_{22}$ of the frequency control circuit 43 are connected to respective gates of transistors 39 and 40 of the step-up circuit 38. Rectangular waves, whose phase deviates by 180 degrees from each other, are output from the frequency control circuit to alternately turn the transistors 39 and 40 on and off with a desired driving frequency. Current supplied from chopper unit 44 flows into the coil 41 or 42 connected to the transistor 39 or 40 which is turned on to be charged as electromagnetic energy. When the transistor 39 or 40 is turned off, the electromagnetic energy, which has been charged in the coil 41 or 42, is discharged and thereby a voltage which is higher than the pulsed supply voltage $V_{PS}$ is generated. Thus, when the two transistors 39 and 40 are alternately turned on and off by the frequency control circuit 43, an alternating drive voltage $V_D$ which closely approximates one-half of a sine wave is applied to each primary electrode 34 of the piezoelectric transformer 32 each half cycle.

The driving frequency of the rectangular wave outputs $V_{21}$, $V_{22}$ is preferably controlled in such a manner that it does not change during the intermittent shutoff period. One method to achieving this result is disclosed in Japanese Unexamined Patent Publication No. 9-107648.

During the period that the fluorescent lamp 36 is turned on, the chopper unit 44 generates a pulsed supply voltage $V_{PS}$ which pulses at a predetermined frequency (the "pulsed supply frequency") and a predetermined duty cycle (the "pulsed supply duty cycle"). The pulsed supply frequency is preferably at least twice as high as the driving frequency of the outputs $V_{21}$, $V_{22}$ of the frequency control 43 (typically about 10 kHz). The pulsed supply duty cycle is controlled to maintain the average value of the pulsed supply voltage $V_{PS}$ at a constant value which ensures that the magnitude of the tube current $I_1$ is at a desired value.

Figures 4A, 4B, 4C, 4D, 4E, 4F:
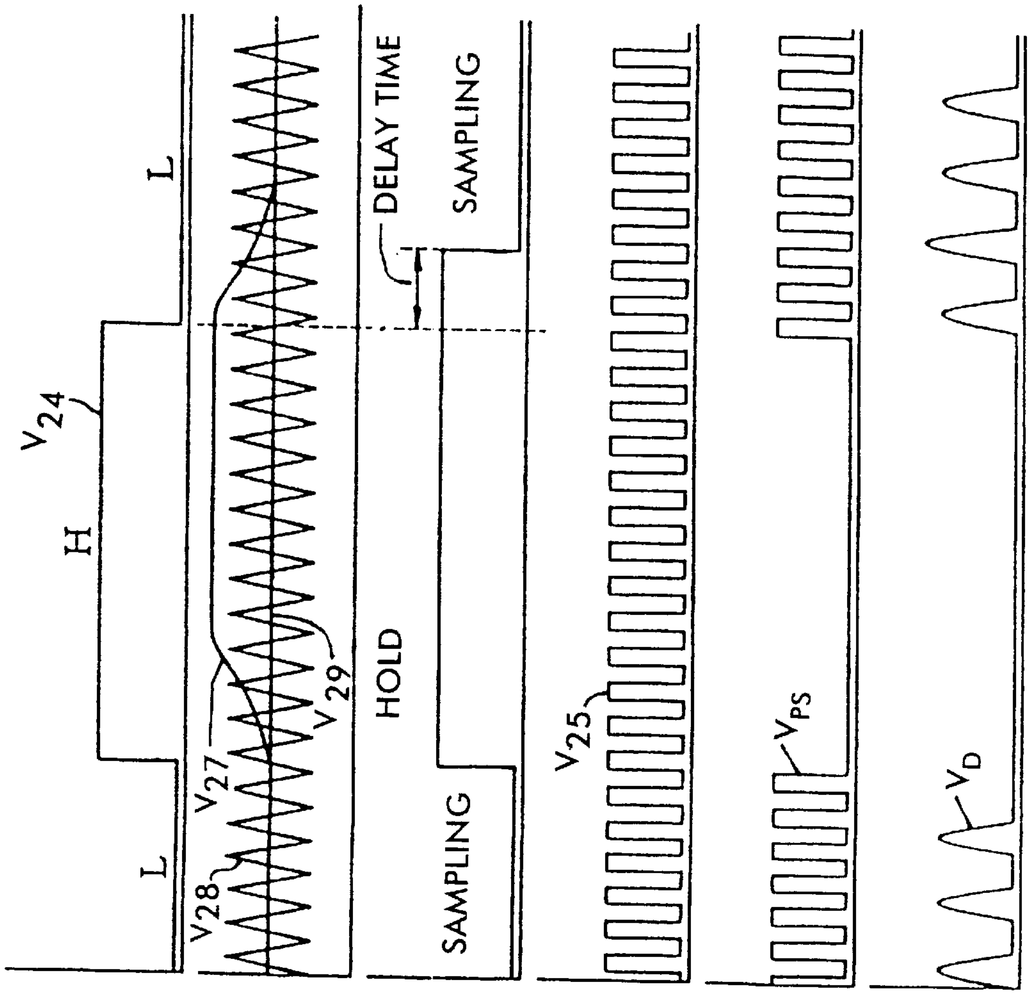
FIGS. 4A 4F show waveforms measured at various points in the piezoelectric transformer inverter shown in FIG. 3.

As best shown in FIG. 4E, the pulsed supply voltage $V_{PS}$ is turned on (i.e., the pulses are generated) and off (i.e., the pulses are not generated) at a predetermined frequency (the "tube lighting frequency") which is much lower than the pulsed supply frequency and with a varying duty cycle (the "tube lighting duty cycle") that varies as a function of the desired brightness of the fluorescent tube 36. The step-up circuit 38 responds to the pulsed supply voltage $V_{PS}$ to adjust the drive voltage $V_D$ applied to the piezoelectric transformer 32 so as to ensure that a desired level of tube current $I_1$ flows through the fluorescent tube 36 when the tube is turned on and so as to vary the time periods in which the fluorescent tube 36 is turned thereby controlling the effective brightness of the tube.

The chopper unit 44 includes a switching device 45 connected between a power-supply input end which receives a supply voltage $V_S$ from a power source such as a battery and an output end of the chopper unit 44. A diode 46 is inserted between the output end of the chopper unit 44 and ground.

The switching device 45 is turned on and off by a control voltage $V_{23}$ applied to its control terminal (e.g., gate). Control voltage $V_{23}$ is generated as a function of a burst dimming signal $V_{24}$ (which controls the switching device 45 so as to inhibit the generation of the pulsed supply voltage $V_{PS}$ during the time periods that the fluorescent tube 36 is to be turned off) and a pulse width control signal $V_{25}$ which controls the duty cycle and frequency of the pulsed supply voltage $V_{PS}$ during the time periods in which the fluorescent tube 36 is to be turned on).

The burst dimming signal $V_{24}$ is generated by burst dimming circuit 59. The burst dimming signal $V_{24}$ (shown in FIG. 4A) is in its high state (H) during the time periods in which the fluorescent tube 36 is to be off and is applied to the switching device 45 via OR gate 58 so as to disable the generation of the pulsed supply voltage $V_{PS}$ during these periods.

The burst dimming circuit 59 generates the burst dimming signal $V_{24}$ as a function of an externally generated dimming voltage applied thereto. The dimming voltage is indicative of the desired brightness of the fluorescent tube 36. The burst dimming circuit comprises a triangle wave generation circuit 60 and a comparator 61, in which triangle waves $V_{26}$ output from the triangle wave generation circuit 60 are compared to the externally supplied dimming voltage to generate the burst dimming signal $V_{24}$ having a set frequency (determined by the frequency of the triangular waves $V_{26}$) and a duty ratio which is determined by the value of the externally generated dimming voltage. The frequency of the burst dimming signal $V_{24}$ is sufficiently lower (typically 200 through a few hundreds Hz) than the driving frequency of the fluorescent tube 36 to avoid variations in the duty cycle of the burst dimming signal $V_{24}$ from affecting the frequency stabilizing function of the driving frequency control unit 62.

As noted above, the burst dimming signal $V_{24}$ is applied to the switching device 45 and suppresses the generation of the pulsed supply voltage $V_{PS}$ during the timer periods in which the burst dimming signal $V_{24}$ is high. As a result, the fluorescent tube 36 is intermittently lit to dim its effective luminance. In addition, when the externally generated dimming voltage input to the burst dimming unit 59 is changed, the duty ratio of the rectangular burst dimming signal $V_{24}$ changes, whereby the duty ratio of the time period during the fluorescent tube 36 is turned on is adjusted to obtain a desired luminance.

In order to maintain the average value of the pulsed supply voltage $V_{PS}$ constant during the period in which the lamp 36 is lit, a feedback circuit defined by smoothing circuit 47, triangle wave generation circuit 55 and comparator 57 is provided. In order to avoid (or at least inhibit) the generation of large voltage spikes in the drive voltage $V_D$ during the transition period in which the burst dimming signal $V_{24}$ switches from its high (H) to its low (L) value, a sample and hold circuit 55 is interposed between the output of the smoothing circuit 47 and the non-inverting input of the comparator 57. The sample and hold circuit 55 ensures that pulse width control signal $V_{25}$ is generated and has a constant frequency and duty cycle even during the time period in which the burst dimming signal $V_{24}$ is high and the fluorescent tube 36 is off. As a result, the duty cycle and frequency of the pulsed supply voltage $V_{PS}$ will remain at the desired value even when the burst dimming signal $V_{24}$ returns to its low (L) value and the tube 36 is relit.

The smoothing circuit 47 serves to sample the pulsed supply voltage $V_{PS}$ and to generate a reference signal $V_{27}$ indicative of the average value of the pulsed supply voltage $V_{PS}$. To this end, the pulsed supply voltage $V_{PS}$ is first averaged in a low pass filter comprising resistor 48 and capacitor 49. The averaged value is then divided in a voltage divider comprising resistors 50, 51 and integrated in an integrating circuit comprising a capacitor 53 and an operational amplifier 52. Any voltage which is larger than reference voltage $V_0$ (input to the operational amplifier 52 from a reference power supply 54) is integrated as reference signal $V_{27}$ which is output by the operational amplifier. The value of reference voltage $V_0$ determines the magnitude of the pulsed supply voltage $V_{PS}$. The reference signal $V_{27}$ (see FIG. 4B) is applied to the sample and hold circuit 55. When the burst dimming signal $V_{24}$ is low and fluorescent tube 36 is switched on, the sample and hold circuit 55 is in the sampling state and the reference signal $V_{27}$ is applied directly to comparator 57. When the burst dimming signal $V_{24}$ is high and the fluorescent tube 36 is switched off, the sample and hold circuit 55 is in the hold state and maintains the value of the reference signal $V_{27}$ immediately before the burst dimming signal $V_{24}$ is switched from its low to the high state. This value of reference signal $V_{27}$ is maintained at the output of the sample and hold circuit 55 and applied to the comparator 57 during the time period in which the burst dimming signal $V_{24}$ is high.

The comparator 57 compares the magnitude of the output $V_{29}$ (see FIG. 4B) of sample and hold circuit 55 with the triangular wave output $V_{28}$ (see FIG. 4B) of the triangle wave generation circuit 56 and generates the pulse width control signal $V_{25}$ (see FIG. 4D) as a function thereof. The frequency of the pulse width control signal $V_{25}$ is determined by the frequency of the triangular waves $V_{28}$ and the duty cycle of the pulse width control signal $V_{25}$ is determined by the magnitude of the integrated output signal $V_{27}$ (which in turn is determined by the average value of the pulsed supply voltage $V_{PS}$). While this duty cycle will change as the average value of the pulsed supply voltage $V_{PS}$ changes, it will ultimately cause the pulsed supply voltage $V_{PS}$ to reach the desired value.

A description will now be provided of the circuit operation of the chopper unit 44 with reference to FIGS. 4A through 4F. FIGS. 4A through 4F show waveforms of various outputs of piezoelectric transformer inverter 31 during a period in which the burst dimming signal $V_{24}$ output from the burst dimming unit 59 changes from its low state to its high state and back to its low state.

FIG. 4A shows the burst dimming signal $V_{24}$. FIG. 4B shows the output $V_{28}$ of the triangle wave generation circuit 56, the reference signal $V_{27}$ output by the smoothing circuit 47, and the output $V_{29}$ of the sample hold circuit 55. FIG. 4C shows changes in the holding and sampling state of the sample hold circuit 55. FIG. 4D shows the pulse width control signal $V_{25}$ output by the comparator 57, FIG. 4E shows the pulsed supply voltage $V_{PS}$ and FIG. 4F shows the drive voltage $V_D$ applied across the input terminals of the piezoelectric transformer 32.

During a period in which the output burst dimming signal $V_{24}$ [FIG. 4A] of the burst dimming unit 59 is high (the period in which the fluorescent tube is switched off), the output $V_{29}$ of the sample and hold circuit 55 is maintained at the level of the integrated output $V_{27}$ of the smoothing circuit 47 immediately before the burst dimming signal $V_{24}$ went high, even though the average value of the pulsed supply voltage $V_{PS}$ of the chopper unit 44 is zero [FIG. 4E]. In this case, although the integrated output $V_{27}$ of the smoothing circuit 47 is larger than the triangular signal $V_{28}$, signals $V_{29}$ of the same duty ratio as that in the period in which the burst dimming signal $V_{24}$ is low are continuously output from the comparator 57 [FIG. 4D]. Thus, even in the period after the burst dimming signal $V_{24}$ has switched from its high state to its low state, the duty cycle of the switching device 45 and therefore the duty ratio of the burst dimming signal $V_{24}$ is not excessively larger (that is, it is sufficiently small to avoid the spikes in the drive voltage $V_D$ which occur in the prior art system).

Accordingly, during the transitional period between the switching-off period of the fluorescent tube 36 and the switching-on period of the fluorescent tube 36, the average value of the pulsed supply voltage $V_{PS}$ is not excessively large, thereby avoiding the problems of the conventional embodiment (i.e., (1) stress to the piezoelectric transformer 32 is large, and (2) an FET with a large withstand voltage needs to be used for the transistors 39 and 40 of the step-up circuit 38).

Preferably, when the sample hold circuit 55 is switched from the sampling state to the holding state, it is quickly switched in response to changes in the burst signals and when it is switched from the holding state to the sampling state, it responds with a slight delay to the burst signals. Since this time lag permits the circuit to be switched into the sampling mode after the output of the smoothing circuit 47 is stabilized, changes in the average value of the pulsed supply voltage $V_{PS}$ can be further reduced.

(Second Embodiment)

Figure 5:
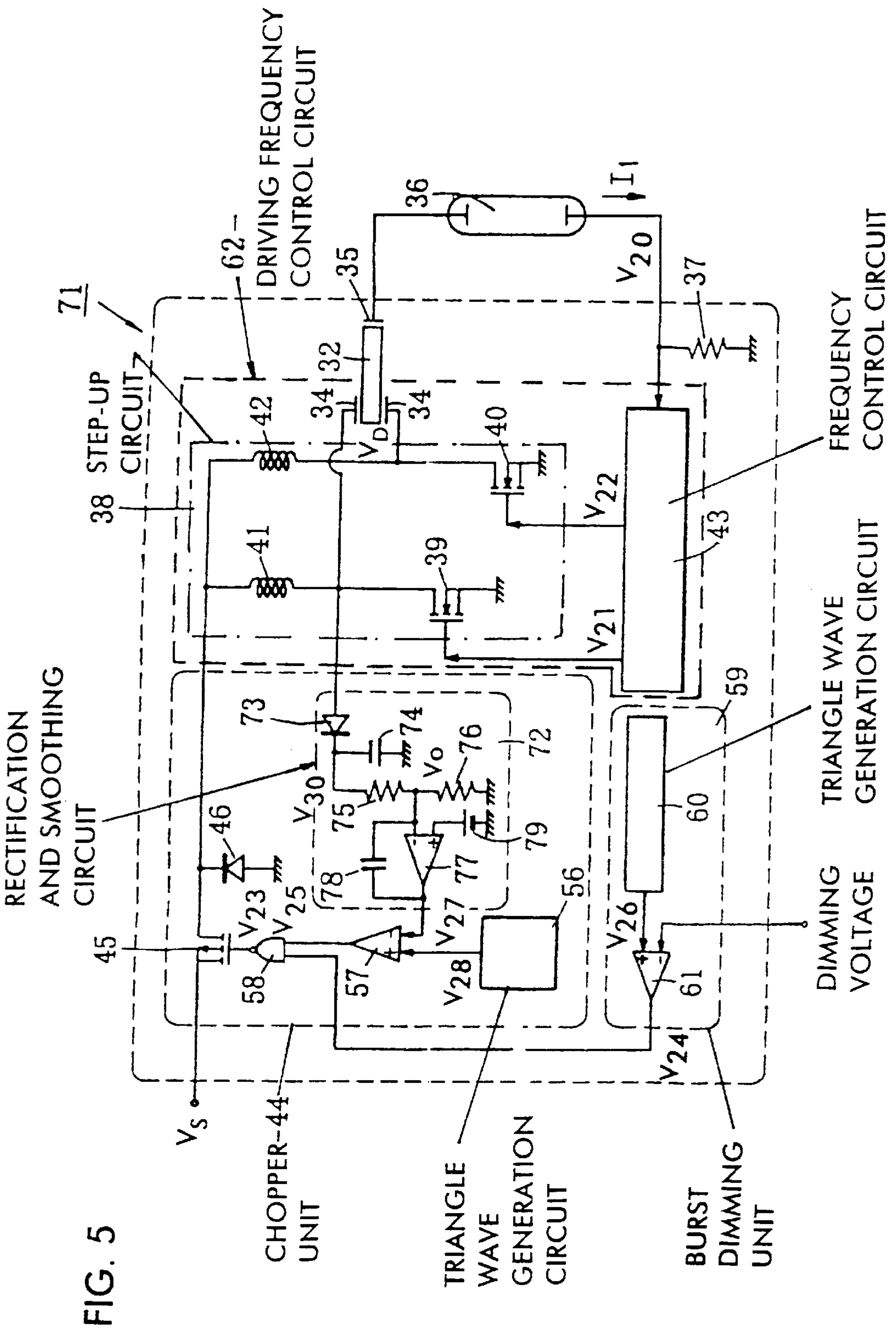
FIG. 5 is a circuit diagram showing a structure of a piezoelectric transformer inverter according to another embodiment of the present invention.

FIG. 5 is a circuit diagram showing a structure of a piezoelectric transformer inverter 71 according to a second embodiment of the present invention. In the piezoelectric transformer converter 71, the structure comprising the piezoelectric transformer 32, the step-up circuit 38, the frequency control circuit 43, and the burst dimming unit 59 is the same as that in the first embodiment. In addition, the chopper unit 44 is the same as that in the first embodiment except for use of the rectification/smoothing circuit 72.

The piezoelectric transformer 32 drives the fluorescent tube 36 to turn it on. The frequency control circuit 43 detects tube current on the fluorescent tube 36, and varies the driving frequency of the step-up circuit 38 in such a manner that current value obtained when the fluorescent tube 36 is being lit is maintained constant. The burst dimming unit 59 allows the chopper unit 44 to intermittently drive or stop the step-up circuit 62 at a frequency significantly lower than the driving frequency of the fluorescent tube 36 to avoid interference with each other and allows the fluorescent tube 36 to be intermittently switched off so as to dim its effective luminance. Furthermore, the burst dimming unit 59 controls the duty ratio of burst signals to adjust the luminance of the fluorescent tube 36 as a function of a dimming voltage applied thereto. As disclosed in Japanese Unexamined Patent Publication No. 9-107684, the driving frequency is preferably controlled so that it does not change during the period in which the burst signals are high.

The chopper unit 44 of this embodiment differs from the one used in the first embodiment as follows. In this chopper unit 44, the primary electrodes 34 of the piezoelectric transformer 32 are connected to input of the rectification/smoothing circuit 72. The drive voltage $V_D$ of the piezoelectric transformer 32 is detected, rectified, and smoothed by circuit 72 and is input as reference signal $V_{27}$ to the inverting input terminal of the comparator 57. The time constant of the rectification/smoothing circuit 72 is set to be sufficiently longer than the cycle $T_B$ of the burst dimming signal $V_{24}$ output from the burst dimming unit 59.

The rectification/smoothing circuit 72 receives the input voltage applied to one of the primary electrodes 34 of the piezoelectric transformer 32 through a diode 73 and high-frequency components of the input voltage are eliminated by a capacitor 74. The resulting voltage is divided by voltage-divider resistors 75 and 76 and input to one terminal of an integrating circuit comprising a capacitor 78 and an operational amplifier 77. A reference voltage $V_0$ from the reference power supply 79 is input to the other terminal of the integrating circuit and the output of the integrating circuit is applied to the inverting input terminal of the comparator 57.

In this way, the chopper unit 44 controls the duty ratio of the switching device 45 so as to allow the output of the rectification/smoothing circuit 72 to be constant. The switching frequency of the switching device 45 is preferably set to be at least twice the driving frequency of the fluorescent tube 36.

Figures 6A, 6B, 6C, 6D, 6E:
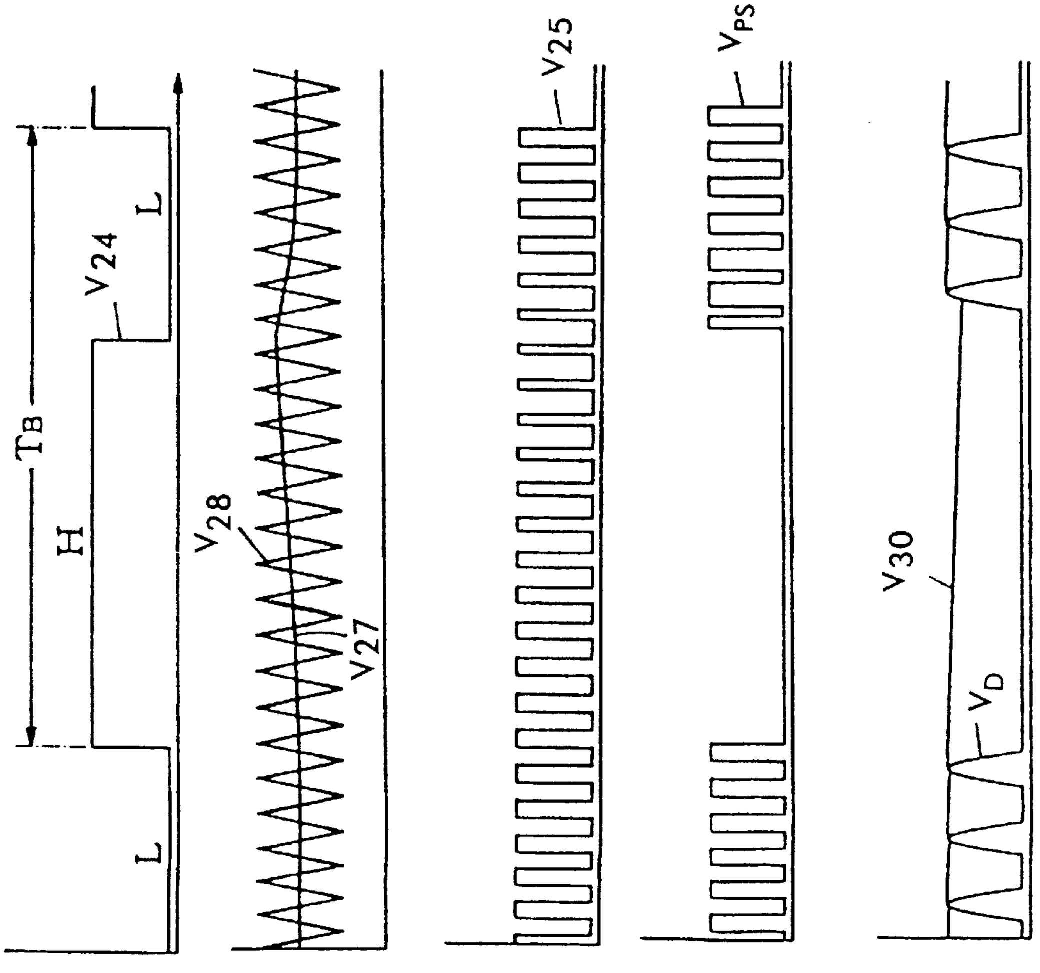
FIGS. 6A 6E show waveforms measured at various points in the piezoelectric transformer inverter shown in FIG. 5.

FIG. 6 illustrates the waveforms of various signals appearing at various points in the inverter 71 during the period in which burst signals are changing from low to high, and back to low. FIG. 6A shows the output $V_{24}$ of the burst dimming unit 59, FIG. 6B shows the output $V_{28}$ of the triangle wave generation circuit 56 of the chopper unit 44 and the reference signal $V_{27}$ generated by the rectification/smoothing circuit 72. FIG. 6C shows the output $V_{25}$ of the comparator 57 of the chopper unit 44, FIG. 6D shows the pulsed supply voltage $V_{PS}$ and FIG. 6E shows the drive voltage $V_D$ and the rectified voltage $V_{30}$ appearing at the cathode of diode 73.

In the piezoelectric transformer inverter 71, the time constant of the rectification/smoothing circuit 72 is set to be sufficiently longer than the cycle $T_B$ of the burst signals, so that even if the burst dimming signal $V_{24}$ is high, the output $V_{27}$ of the rectification/smoothing circuit 72 does not, as shown in FIG. 6B, immediately become large and the output $V_{25}$ of the comparator 57 maintains a value close to its output value during the period in which the burst dimming signals $V_{24}$ are low. Consequently, even if the burst dimming signal $V_{24}$ changes from its low value to its high value, the output $V_{25}$ of the comparator 57 will have a duty ratio similar to that of its duty ratio during the period in which the burst dimming signal is low. Therefore, as in the case of the first embodiment, even during the transitional period following the instant in which the burst dimming signal $V_{24}$ has switched from its high value to its low value, the duty ratio of the switching device 45 (and therefore the duty ratio of the pulsed supply voltage $V_{PS}$) does not significantly change and the drive voltage $V_D$ applied to the piezoelectric transformer 32 will not be excessively large during the transition period.

Although this embodiment is similar to the case of a circuit disclosed in Japanese Unexamined Patent Publication No. 9-107684, new advantages can be obtained by adding a constraint, that is a time constant of the rectification/smoothing circuit 72 is set to be sufficiently longer than the cycle $T_B$ of burst signals in order to maintain the rectified voltage substantially constant even during the period in which the pulsed dimming signal $V_{24}$ is high and the fluorescent bulb 36 is not lit.

(Third Embodiment)

Figure 7:
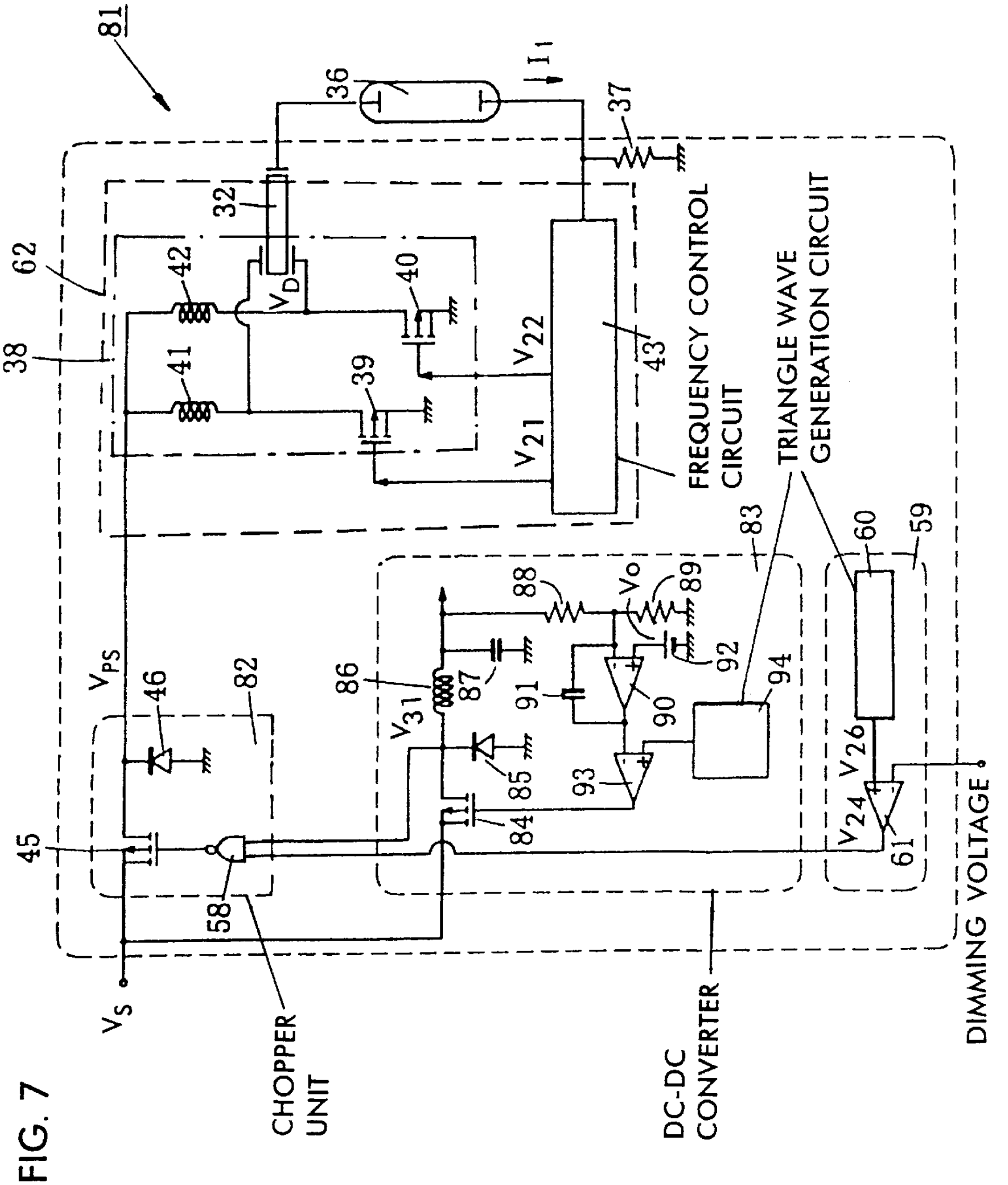
FIG. 7 is a circuit diagram showing a structure of a piezoelectric transformer inverter according to another embodiment of the present invention.

FIG. 7 is a circuit diagram showing a structure of a piezoelectric transformer inverter 81 according to a third embodiment of the present invention. The structure of the piezoelectric transformer 32, the step-up circuit 38, the frequency control circuit 43, and the burst dimming unit 59 is the same as that in the first embodiment. In addition, a chopper unit 82 is also the same as the unit employed in the first embodiment except for use of a DC-DC converter 83.

The piezoelectric transformer 32 drives the fluorescent tube 36 to make it light. The frequency control circuit 43 detects tube current of the fluorescent tube 36, and varies driving frequencies of the step-up circuit 38 in such a manner that the current value obtained when the fluorescent tube 36 is being lit is maintained constant. The burst dimming unit 59 intermittently drives or stops the chopper unit 44 at a frequency sufficiently lower than the driving frequency of the fluorescent tube 36 to intermittently switch off the fluorescent tube 36 to dim its luminance. Furthermore, the burst dimming unit 59 controls the duty cycle of burst dimming signals $V_{24}$ according to an externally generated dimming voltage to adjust the luminance of the fluorescent tube 36. As in the case of the embodiment in Japanese Unexamined Patent Publication No. 9-107684, control is preferably given in such a manner that the driving frequency does not change during the period in which the burst signals are high.

In this embodiment, a DC-DC converter 83 is inserted between the input end of the chopper unit 82 and the input of the OR gate 58. The DC-DC converter 83 forms a step-down type converter to generate a constant voltage (circuit power supply) for driving the control circuit section by stepping down the power supply voltage $V_S$.

More specifically, in the DC-DC converter 83, a switching device 84 and a choke coil 86 are connected in series between the power supply voltage $V_S$ and a circuit power-source supply unit 96, which is connected to ground through a capacitor 87. Thus, when the switching device 84 is switched on, direct current is supplied to the circuit power-source supply unit 96 through a low-pass filter comprising the choke coil 86 and the capacitor 87. The output voltage from the circuit power-source supply unit 96 is divided by two voltage-divider resistors 88 and 89 and then, the divided voltage is input to the non-inverting input terminal of an integrating circuit comprising a capacitor 91 and an operational amplifier 90. An input voltage which is larger than the reference voltage $V_0$ supplied from a reference power supply 92 is integrated in the integrating circuit and the integrated result is input to the inverting input terminal of a comparator 93. A triangle wave generation circuit 94 is connected to the non-inverting input terminal of the comparator 93, which outputs a rectangular waves whose duty ratio is determined in accordance with the output from the integrating circuit to switch the switching device 84 on and off. Therefore, the circuit power-source supply unit 96 of the DC-DC converter outputs direct current which has been converted into lower voltage $V_{31}$ than the power supply voltage $V_S$ according to the duty ratio with respect to the ON/OFF status of the switching device 84. The feedback of power supply voltage which is output from the circuit power-source supply unit 96 is performed to switch the switching device 84 on and off, whereby direct current voltage that is output from the circuit power-source supply unit is stabilized.

The DC-DC converter 83 is designed in such a manner that the choke coil 86 is appropriately selected to drive the DC-DC converter 83 in a current continuity mode. In addition, the driving frequency of the DC-DC converter 83 (an output frequency of the triangle wave generation circuit 94) is set to a frequency of at least twice as high as the driving frequency of the fluorescent tube 36.

Additionally, the signal $V_{31}$ appearing at the midpoint between the switching device 84 and the choke coil 86 is connected to the input of the OR gate 58 of the chopper unit 82 and at the same time is connected to a ground through a diode 85. In this way, the chopper unit 82 drives the switching device 45 by using rectangular wave signals $V_{31}$ which the switching device 84 of the DC-DC converter 83 outputs to the choke coil 86.

In this embodiment, the output $V_{31}$ of the DC-DC converter 83 is maintained constant regardless of whether the burst dimming signals are high or low; and rectangular wave signals are constantly output from the switching device 84 of the DC-DC converter. As a result, regardless of the state (high or low) of the burst dimming signals, the duty ratio of the rectangular wave signals $V_{31}$ which are output of the choke coil 86 by the switching device 84 of the DC-DC converter is maintained constant. The chopper unit 82 is driven by the signals $V_{24}$, $V_{31}$, and even the period during which the burst dimming signal is high and the chopper unit is at rest, rectangular wave signals $V_{31}$ sent to the chopper unit 82 from the DC-DC converter 83 are sustained in a specified duty ratio. As a result, for the same reason as the case of the second embodiment, even during the transitional period after the burst dimming signal $V_{24}$ have switched from its high value to its into low value, the duty ratio of the switching device 45 does not vary (and the average value of the pulsed supply voltage $V_{PS}$), so that an excessively large average drive voltage $V_D$ is not applied to the piezoelectric transformer 32.

In this embodiment, for example, when a low withstand-voltage semiconductor device such as CMOS or a circuit requiring a stable voltage is used in the piezoelectric transformer inverter, since a stable voltage can be supplied from the circuit power-source supply unit 96 of the DC-DC converter 83, there is no need for using another power source in the piezoelectric transformer inverter or supplying the voltage from another outside power source outside, so that miniaturization of the circuit and cost reduction can be achieved. Moreover, although it is necessary that a certain amount of tube current be eliminated from the DC-DC converter 83 to allow it to operate in a current continuity mode, the tube current is consumed as drive current of circuit devices inside the piezoelectric transformer inverter, so that there is no waste in power consumption and high efficiency can be maintained.

(Fourth Embodiment)

Figure 8:
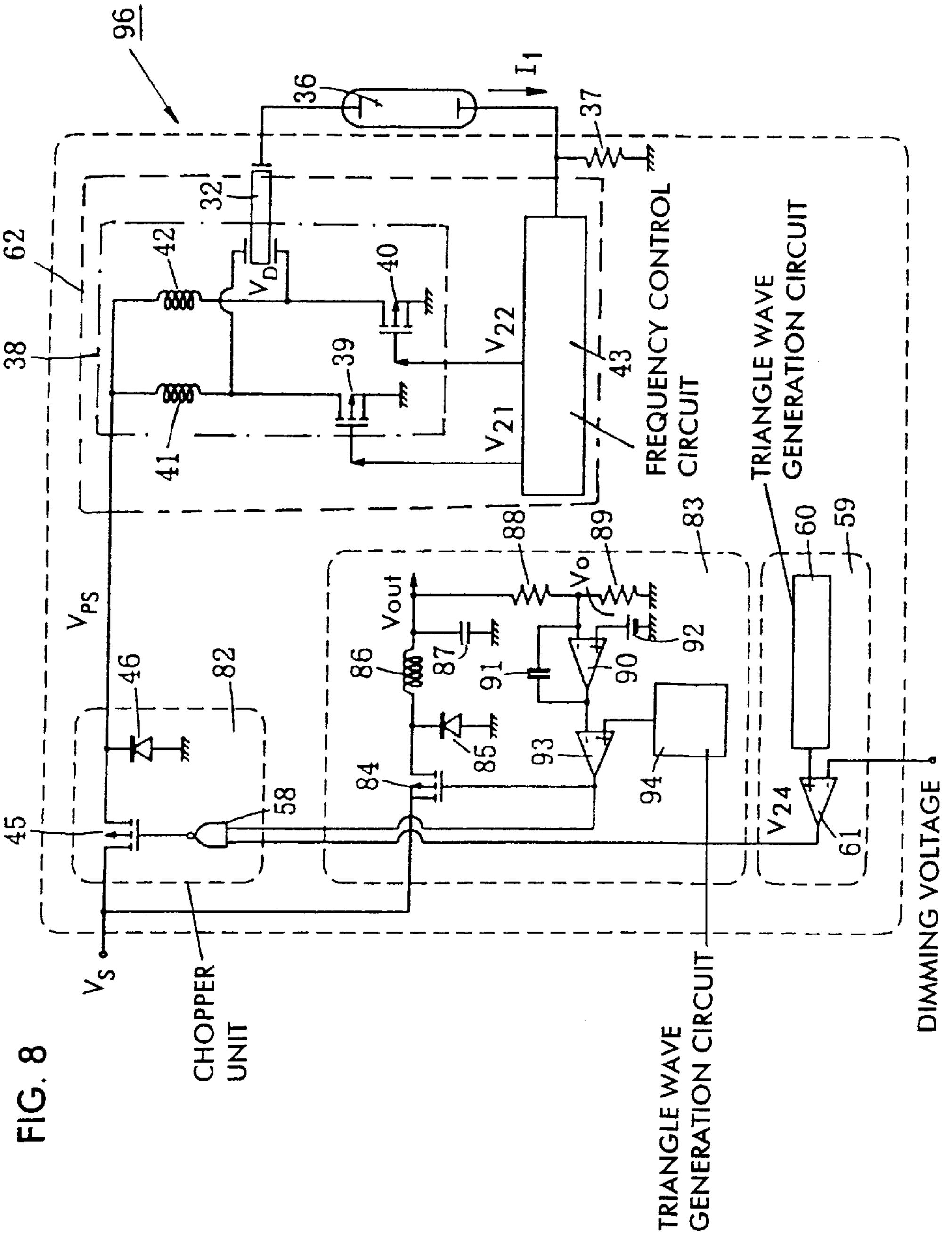
FIG. 8 is a circuit diagram showing a structure of a piezoelectric transformer inverter according to another embodiment of the present invention.

FIG. 8 is a circuit diagram showing a structure of a piezoelectric transformer inverter according to a fourth embodiment of the present invention. Although this embodiment has substantially the same circuit structure as that of the third embodiment, the third embodiment uses the rectangular wave signals output to the choke coil 86 from the switching device 84 of the DC-DC converter in the chopper unit 82, whereas this embodiment uses the rectangular wave signals output from the comparator 93 inside the DC-DC converter to drive the switching device 45 of the chopper unit 82.

In this embodiment, as in the case of the third embodiment, during the period in which the burst dimming signals are high and the chopper unit 82 is at rest, the duty ratio of the switching device 45 does not vary regardless of the burst dimming signals, since rectangular wave signals of a specified duty ratio are sent to the chopper unit 82, even during the transitional period after the burst signals of the burst dimming unit 59 have switched from high into low. As a result, an excessively large average input voltage is not applied to the piezoelectric transformer 32.

(Fifth Embodiment)

Figure 9:
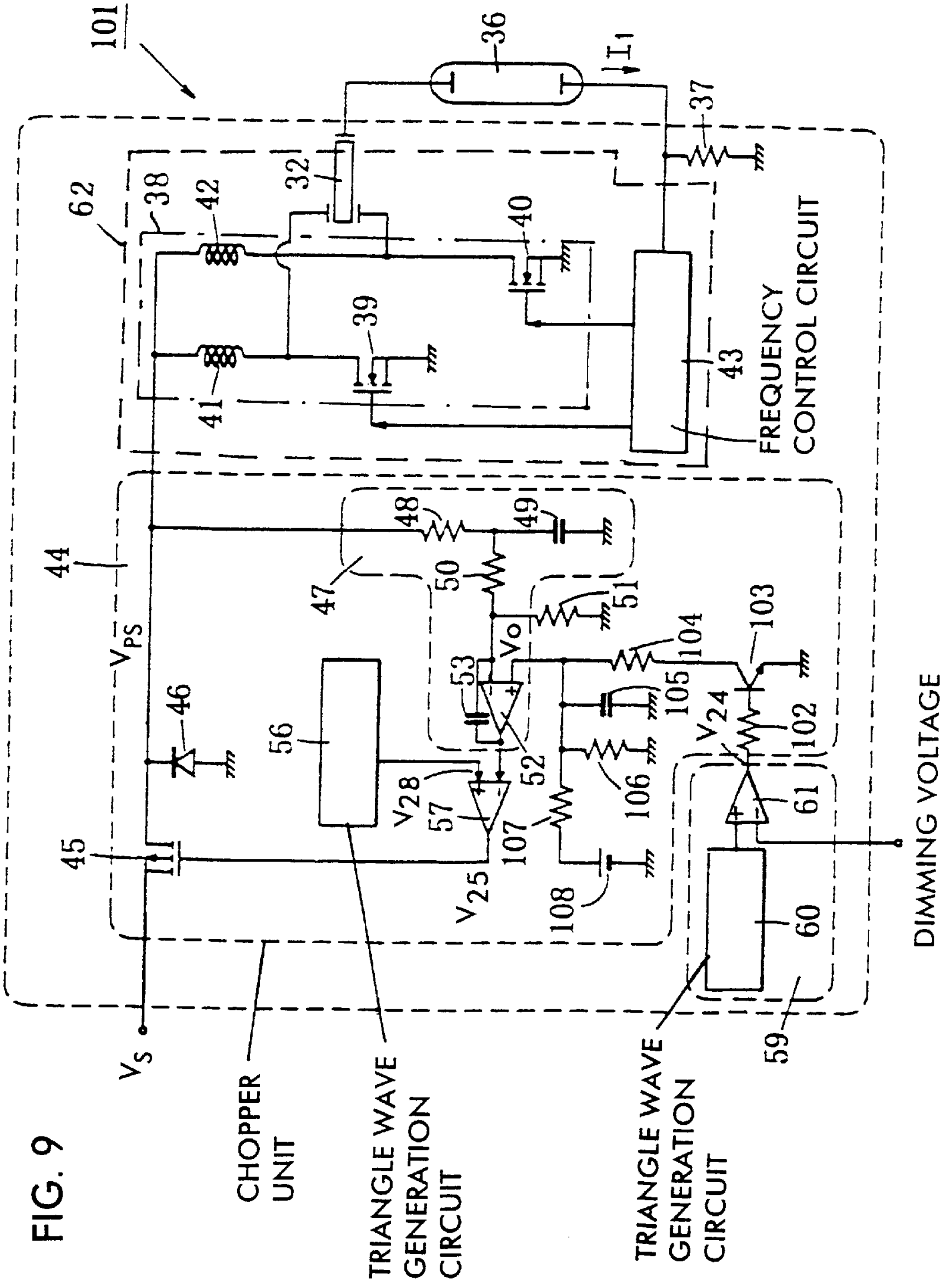
FIG. 9 is a circuit diagram showing a structure of a piezoelectric transformer inverter according to another embodiment of the present invention.

FIG. 9 is a circuit diagram showing a structure of a piezoelectric transformer inverter 101 according to a fifth embodiment of the present invention. In the piezoelectric transformer inverter 101, the structure comprising the piezoelectric transformer 32, the step-up circuit 38, the frequency control circuit 43, and the burst dimming unit 59 is the same as the case of the first embodiment.

The piezoelectric transformer 32 drives the fluorescent tube 36 to make it light. The frequency control circuit 43 detects the tube $I_1$ current of the fluorescent tube 36 and varies a driving frequency of the step-up circuit 38 in such a manner that current value obtained when the fluorescent tube 36 is being lit is maintained constant. The burst dimming unit 59 intermittently drives or stops the chopper unit 44 at a frequency sufficiently lower than the driving frequency of the fluorescent tube 36 to avoid interference with the current stabilizing function of frequency control circuit 43 and thereby intermittently switches off the fluorescent tube 36 to dim the luminance. Furthermore, according to the value of an externally generated dimming voltage, the burst dimming unit 59 controls the duty ratio of burst dimming signal $V_{24}$ to adjust the luminance of the fluorescent tube 36. As in the case of the embodiment in Japanese Unexamined Patent Publication No. 9-107684, control is preferably given in such a manner that the driving frequency does not change during the period in which the burst signals are high.

The copper unit 44 and the smoothing circuit 47 have the same structure as that used in the first embodiment (FIG. 3). The pulsed source voltage $V_{PS}$, smoothed by the smoothing circuit 47 are compared to triangle waves $V_{28}$ output from the triangle wave generation circuit 56 in comparator 57. The output $V_{25}$ of the comparator 57 is connected directly to the control terminal (gate) of the switching device 45.

A reference power supply 108 through a resistor 107, a resistor 106, and a capacitor 105 are connected in parallel to the non-inverting input terminal of the comparator 52 of the smoothing circuit 47. A resistor 104 and a transistor 103 are connected in series between the non-inverting input terminal of the comparator 52 and ground and a base of the transistor 103 is connected to the output of the burst dimming unit 59 through a resistor 102.

Accordingly, a reference voltage $V_0$, input to the non-inverting input terminal of the comparator 52 in the smoothing circuit 47, varies with respect to burst dimming signals output from the burst dimming unit 59. As a result, the reference voltage $V_0$ input to the non-inverting input terminal of the comparator 52 in the smoothing circuit 47 varies with a trapezoid shape, depending on whether the burst signals are high or low, and the duty ratio of the chopper unit 44 varies to intermittently increase or decrease an average drive voltage $V_D$ applied to the piezoelectric transformer 32. Thus, varying the duty ratio of burst signals as a function of an externally generated dimming voltage permits the luminance of the fluorescent tube 36 to be controlled.

Figure 10A:
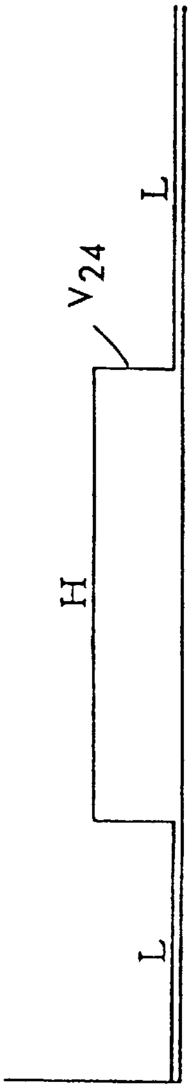
FIGS. 10A to 10E show waveforms measured at various points in the piezoelectric transformer inverter shown in FIG. 9.
Figure 10B:
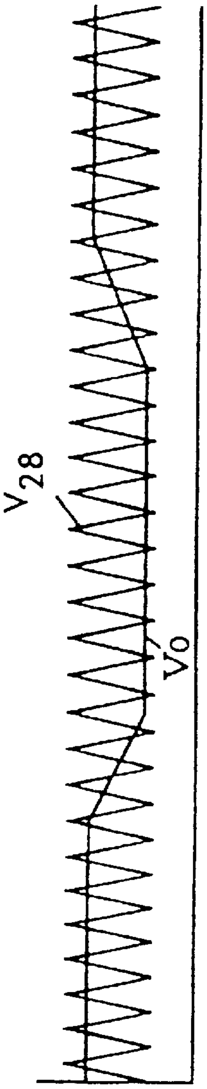
Figure 10C:
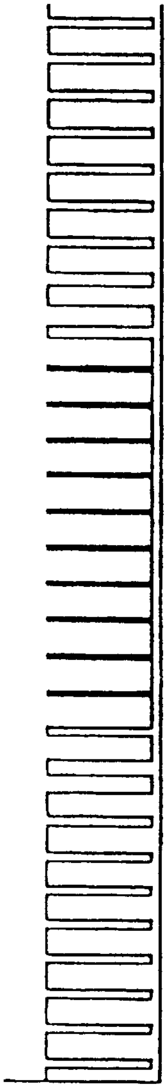
Figure 10D:
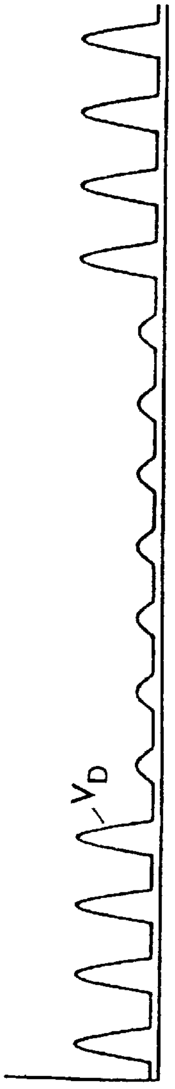
Figure 10E:
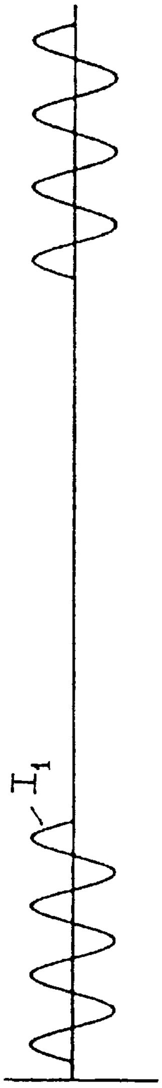

The circuit operation of the chopper unit 44 will be explained referring to FIGS. 10A through 10E. FIG. 10 shows waveforms various signals appearing in the circuit during the period in which the burst signals $V_{24}$ output from the burst dimming unit 59 are changing from low to high, and back to low. FIG. 10A shows the burst dimming signal $V_{24}$; FIG. 10B shows the triangle waves $V_{28}$ generated by the triangular wave generation circuit 56 and a reference voltage $V_0$ input to the comparator 52 of the smoothing circuit 47; FIG. 10(*c*) shows the pulsed source voltage $V_{PS}$;

FIG. 10(*d*) shows the drive voltage $V_D$ applied to the piezoelectric transformer 32; and FIG. 10(*a*) shows the tube current $I_1$ flowing in the fluorescent tube 36.

Referring to FIG. 10, a description of the operation of inverter 101 will be provided. The reference voltage $V_0$ of the smoothing circuit 47 varies in a trapezoid shape as a formation of the burst dimming signals $V_{24}$ [FIG. 10B]. When as the reference voltage $V_0$ decreases, the duty ratio of output of the chopper unit 44 decreases [FIG. 10C], and an average value of the drive voltage $V_D$ applied to the piezoelectric transformer 32 decreases [FIG. 10(*d*)]. As a result, the output of the piezoelectric transformer 32 is smaller so that the fluorescent tube 36 cannot maintain the lighting state and is switched off [FIG. 10(*e*)]. Accordingly, intermittent switching on/off can be performed.

Furthermore, during the transitional period after the reference voltage $V_0$ has been changed in a trapezoid shape and the burst dimming signal $V_{24}$ has changed from its high to its low state, the duty cycle of the pulsed supply voltage $V_{PS}$ increases gradually. Thus, even if there is a control delay of the chopper unit 44, the duty ratio of the chopper unit 44 is not excessively large and thereby excessively large average drive voltages are not applied to the piezoelectric transformer 32.

Although this embodiment has shown an example in which some amount of an average output of the chopper unit 44 is produced even during the period in which the burst signals are high, the output of the chopper unit 44 may be set to be completely zero volt during the period in which the burst signals are high.

In the described embodiments, variations in the magnitude of the drive voltage $V_D$ are suppressed during the period when the fluorescent tube is first lit. It is preferred that the suppression be sufficient to prevent the magnitude of the drive voltage $V_D$ from exceeding its nominal value by more than %.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A piezoelectric transformer inverter, comprising:

a piezoelectric transformer for converting an alternating voltage applied between its primary electrodes to an alternating drive current which is supplied to a load connected to a secondary electrode of the piezoelectric transformer;

a driving frequency control circuit for controlling the frequency of the drive current so that the frequency of the drive current remains substantially constant;

a chopper unit for supplying an alternating pulsed supply voltage having a frequency which is at least twice as high as the frequency of the load current applied to the load by chopping an input voltage applied thereto and for controlling the average value of the pulsed supply voltage by changing the duty cycle of the pulsed supply voltage; and a dimming unit for intermittently disabling the driving frequency control circuit by intermittently disabling the operation of the chopper circuit, said chopper unit being intermittently disabled at a frequency which is smaller than the frequency of the drive current;

wherein signals having a duty ratio for allowing the chopper circuit to perform the chopping operation are sustained inside the chopper circuit during the period in which the dimming circuit is intermittently disabling the chopping circuit.

2. The piezoelectric transformer inverter according to claim 1, wherein the chopper unit has a switching device for driving or stopping the chopper unit; and wherein the switching device is turned on or turned off by the signals having a duty ratio for allowing the chopper unit to perform the chopping operation, and the switching device and the signals having a duty ratio for allowing the chopper unit to perform the chopping operation are connected or disconnected by an output level of the dimming unit.

3. A piezoelectric transformer inverter comprising:

a piezoelectric transformer for performing voltage conversion of alternating voltage applied between primary electrodes to supply to a load connected to a secondary electrode;

a driving-frequency control unit for controlling load current driving of the load by changing the driving frequency of the piezoelectric transformer;

a chopper unit for chopping an input voltage applied into the driving-frequency control unit at a frequency at least twice as high as the driving frequency and for controlling an average input voltage applied to the driving frequency control unit by changing a duty ratio of the chopping operation; and a dimming unit for intermittently stopping the driving frequency control unit by intermittently stopping the operation of the chopper unit at a frequency smaller than the driving frequency of the piezoelectric transformer;

wherein when the chopper unit is changed from the stopping state into the driving state by the dimming unit, the duty ratio for allowing the chopper unit to perform the chopping operation is set to gradually increase.

4. A process for dimming a light source, said process comprising:

applying a drive voltage to at least one primary electrode of a piezoelectric transformer which converts said drive voltage to a drive current applied to a light source;

generating said drive voltage in a step-up circuit as a function of a pulsed supply voltage applied thereto; and alternatively supplying and not supplying said pulsed supply voltage to said step-up circuit at a constant dimming frequency and a varying dimming duty cycle so as to alternatively turn said light source on and off thereby effectively dimming said light source, said dimming duty cycle varying as a function of an externally supplied dimming signal indicative of the desired dimming level of said light source, said pulsed supply voltage comprising a plurality of pulses having a pulse frequency which is at least twice as high as said dimming frequency and a pulse duty cycle which remains substantially constant throughout the period in which said light source is lit.

5. The process of claim 4, further including the step of controlling the operation of said step-up circuit in a manner that maintains the current through said light source constant.

6. The process of claim 4, wherein said act of alternatively supplying and not supplying said pulsed voltage comprises the acts of:

generating a pulsed control signal whose duty cycle remains substantially constant;

generating a burst dimming signal having said constant dimming frequency and said varying dimming duty cycle; and using said pulsed signal and said burst dimming signal to control an electronic switch used to control the generation of said pulsed supply voltage.

7. The process of claim 6, wherein said pulsed control signal is generated as a function of a reference signal which is indicative of the magnitude of said pulsed supply voltage.

8. The process of claim 7, further including the step of preventing changes in the value of said reference signal during the time period in which said pulsed supply voltage is not supplied to said step-up circuit.

9. The process of claim 8, wherein said preventing step is carried out using a sample and hold circuit which samples the value of said reference signal during the time period in which said pulsed supply voltage is supplied to said step-up circuit and holds that voltage during the time period in which said pulsed supply voltage is not supplied to said step-up circuit.

10. The process of claim 6, wherein said pulsed control signal is generated as a function of a reference signal which is indicative of the magnitude of said drive voltage.

11. The process of claim 10, further including the step of preventing changes in the value of said reference signal during the time period in which said pulsed supply voltage is not supplied to said step-up circuit.

12. The process of claim 11, wherein said preventing step is carried out using a smoothing circuit which inhibits variations in said signal indicative of the value of said drive voltage during the time period in which said pulsed supply voltage is not supplied to said step-up circuit.

13. The process of claim 6, wherein said pulsed control signal is generated as a function of an input supply voltage.

14. Apparatus for dimming a light source, said apparatus comprising:

a piezoelectric transformer which converts a drive voltage applied to at least one of its primary electrodes into a current appearing at at least one of its secondary electrodes and applied to a light source;

a step-up circuit for generating said drive voltage as a function of a pulsed supply voltage supplied thereto;

an electronic switch coupled between a power source and said step-up circuit for chopping an input voltage supplied by said power source and applying said chopped voltage to said step-up circuit as said pulsed supply voltage; and a control circuit for controlling the operation of said electronic switch so as to cause said electronic switch to alternatively supply and not supply said pulsed supply voltage to said step-up circuit at a constant dimming frequency and a varying dimming duty cycle so as to alternatively turn said light source on and off thereby effectively dimming said light source, said dimming duty cycle varying as a function of an externally supplied dimming signal indicative of the desired dimming level of said light source, said pulsed supply voltage comprising a plurality of pulses having a pulse frequency which is at least twice as high as said dimming frequency and a pulse duty cycle which remains substantially constant throughout the period in which said light source is lit.

15. The apparatus of claim 14, wherein said control circuit:

generates a pulsed control signal whose duty cycle remains substantially constant;

generates a burst dimming signal having said constant dimming frequency and said varying dimming duty cycle; and used said pulsed signal and said burst dimming signal to control said electronic switch.

16. The apparatus of claim 15, wherein said control circuit generates said pulsed control signal as a function of a reference signal which is indicative of the magnitude of said pulsed supply voltage.

17. The apparatus of claim 16, wherein said control circuit prevents changes in the value of said reference signal during the time period in which said pulsed supply voltage is not supplied to said step-up circuit.

18. The apparatus of claim 17, wherein said control circuit prevents changes in the value of said reference signal using a sample and hold circuit which samples the value of said reference signal during the time period in which said pulsed supply voltage is supplied to said step-up circuit and holds that value during the time period in which said pulsed supply voltage is not supplied to said step-up circuit.

19. The apparatus of claim 15, wherein said control circuit generates said pulsed control signal as a function of a reference signal which is indicative of the magnitude of said drive voltage.

20. The apparatus of claim 19, wherein said control circuit prevents changes in the values of said reference signal during the time period in which said pulsed supply voltage is not supplied to said step-up circuit.

21. The apparatus of claim 20, wherein said control circuit prevents changes in the value of said reference signal during the time period in which said pulsed supply voltage is not supplied to said step-up using a smoothing circuit which inhibits variations in said reference signal during the time period in which said pulsed supply voltage is supplied to said step-up circuit.

22. The apparatus of claim 15, wherein said pulsed control signal is generated as a function of said input supply voltage.

* * * * *